(12) United States Patent
Dukkipati et al.

(10) Patent No.: US 10,867,830 B2
(45) Date of Patent: Dec. 15, 2020

(54) ROOM TEMPERATURE DEBONDABLE AND THERMALLY CURABLE COMPOSITIONS

(71) Applicant: PROMERUS, LLC, Brecksville, OH (US)

(72) Inventors: Venkat R. Dukkipati, Newport Beach, CA (US); Xianhe Wei, Medford, MA (US); Larry F. Rhodes, Brecksville, OH (US)

(73) Assignee: PROMERUS, LLC, Akron, OH (US)

( * ) Notice: Subject to any disclaimer, the term of this patent is extended or adjusted under 35 U.S.C. 154(b) by 132 days.

(21) Appl. No.: 16/169,960

(22) Filed: Oct. 24, 2018

(65) Prior Publication Data

US 2019/0088525 A1   Mar. 21, 2019

Related U.S. Application Data

(62) Division of application No. 14/918,757, filed on Oct. 21, 2015, now Pat. No. 10,141,216.

(60) Provisional application No. 62/066,950, filed on Oct. 22, 2014.

(51) Int. Cl.
| | | |
|---|---|---|
| *H01L 21/683* | (2006.01) | |
| *B32B 7/06* | (2019.01) | |
| *B32B 7/10* | (2006.01) | |
| *C09J 5/06* | (2006.01) | |
| *C09J 7/02* | (2006.01) | |

(52) U.S. Cl.
CPC .......... *H01L 21/6835* (2013.01); *B32B 7/06* (2013.01); *B32B 7/10* (2013.01); *C09J 5/06* (2013.01); *C09J 2203/326* (2013.01); *C09J 2301/502* (2020.08); *C09J 2453/00* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC ...................................................... H01L 21/683
USPC ....................................................... 428/690
See application file for complete search history.

(56) References Cited

U.S. PATENT DOCUMENTS

| | | |
|---|---|---|
| 7,759,050 B2 | 7/2010 | Kessel et al. |
| 7,988,807 B2 | 8/2011 | Noda et al. |
| 8,696,864 B2 | 4/2014 | Dukkipati et al. |
| 2002/0197482 A1 | 12/2002 | Tukachinsky et al. |
| 2009/0218560 A1 | 9/2009 | Flaim et al. |
| 2010/0043608 A1 | 2/2010 | Jakob |
| 2013/0192754 A1 | 8/2013 | Dukkipati et al. |

(Continued)

FOREIGN PATENT DOCUMENTS

JP   5074719 B2   11/2012

OTHER PUBLICATIONS

R. A. Kirchhoff et al., "Benzocyclobutenes in Polymer Synthesis," Prog. Polym. Sci., vol. 18, 85-185, 1993.

(Continued)

*Primary Examiner* — Duc Truong
(74) *Attorney, Agent, or Firm* — Balaram Gupta

(57) ABSTRACT

Embodiments in accordance with the present invention are directed to a method of fabricating a semiconductor device wherein a device wafer substrate is coated with a composition encompassing a surface energy modifier and a thermally stable polymer which is then bonded to a carrier wafer substrate coated with a composition encompassing a crosslinkable polymer composition. The polymer composition allows thinning of a device wafer before separating from the carrier wafer at room temperature.

20 Claims, 2 Drawing Sheets

(56) References Cited

U.S. PATENT DOCUMENTS

2014/0117504 A1  5/2014  Oliver et al.
2014/0150972 A1  6/2014  Koellnberger et al.

OTHER PUBLICATIONS

J. Yang, et al., "Synthesis, thermal and mechanical properties of benzocyclobutene-functionalized siloxane thermosets with different geometric structures," European Polymer Journal, 48 (2012) 751-760.
L. Yang, et al., "Synthesis and properties of cross-linkable polysiloxane vis incorporating benzocyclobutene", High Performance Polymers, 2014, vol. 26(4), 463-469.
Keltan EPDM Product Brochure LXS-TRP 009, Jan. 2012.

ROOM TEMPERATURE DEBONDABLE AND THERMALLY CURABLE COMPOSITIONS

CROSS REFERENCE TO RELATED APPLICATIONS

This application is a divisional of U.S. application Ser. No. 14/918,757, filed Oct. 21, 2015, now U.S. Pat. No. 10,141,216, which claims the benefit of U.S. Provisional Application No. 62/066,950, filed Oct. 22, 2014, which is incorporated herein by reference in its entirety.

BACKGROUND OF THE INVENTION

Field of the Invention

The present invention relates generally to polymer compositions for forming temporary or releasable bonds. More specifically, the present invention relates to cross-linkable polymeric adhesive compositions which are useful in bonding a plurality of wafers yet capable of debonding the wafers at room temperature using a mechanical force and methods for fabricating semiconductor devices encompassing these compositions.

Description of the Art

There has been several methods proposed to form various electronic and microelectronic devices using arrays of wafer substrates ranging in size from 1-12 inches, which are fabricated using a plurality of wafer substrates, and are debonded to form individual devices. For example, U. S. Patent Application Publication No. 2009/0218560 A1 discloses a method for temporary bonding a wafer on to a substrate. However, the compositions disclosed therein are not suitable for high temperature operations as typically required for the fabrication of various electronic and microelectronic devices.

Similarly, U. S. Patent Application Publication No. 2008/0014532 A1 discloses certain of the curable silicone adhesives suitable for fabricating thin quartz devices suitable in a variety of semiconductor applications. However, this approach requires the use of glass carrier wafer which is expensive and thus not suitable in some applications. In addition, the method described therein requires a special laser in order to release the adhesive layer, thus adding further cost in fabricating the devices.

Accordingly, it is an object of this invention to provide a cost effective method for temporarily bonding two or more wafers such that the bonded stack has sufficient thermal, mechanical and chemical stability for fabricating a semiconductor device while at the same time it is possible to debond the wafers at room temperature using a mechanical force, and to provide compositions to facilitate such methods.

Other objects and further scope of the applicability of the present invention will become apparent from the detailed description that follows.

SUMMARY OF THE INVENTION

There is provided a method of fabricating a semiconductor device comprising:

forming a first polymer layer over a surface of a first substrate where said polymer layer comprises a thermally stable and crosslinkable polymer, a crosslinking agent, and a surface energy modifier additive;

forming a second polymer layer over a surface of a second substrate where second polymer comprises a thermally stable and cross-linkable polymer and a crosslinking agent;

bonding thermally said surface of first substrate with said surface of second substrate at a first temperature, said first temperature being lower than a crosslinking temperature of said crosslinking agent;

subjecting said bonded substrates to a second temperature so as to allow crosslinking of said first polymer on first substrate with said second polymer on said second substrate, said second temperature being higher than said first temperature; and debonding said first substrate from said second substrate at room temperature by applying a mechanical force.

DETAILED DESCRIPTION OF THE INVENTION

Figure 1:
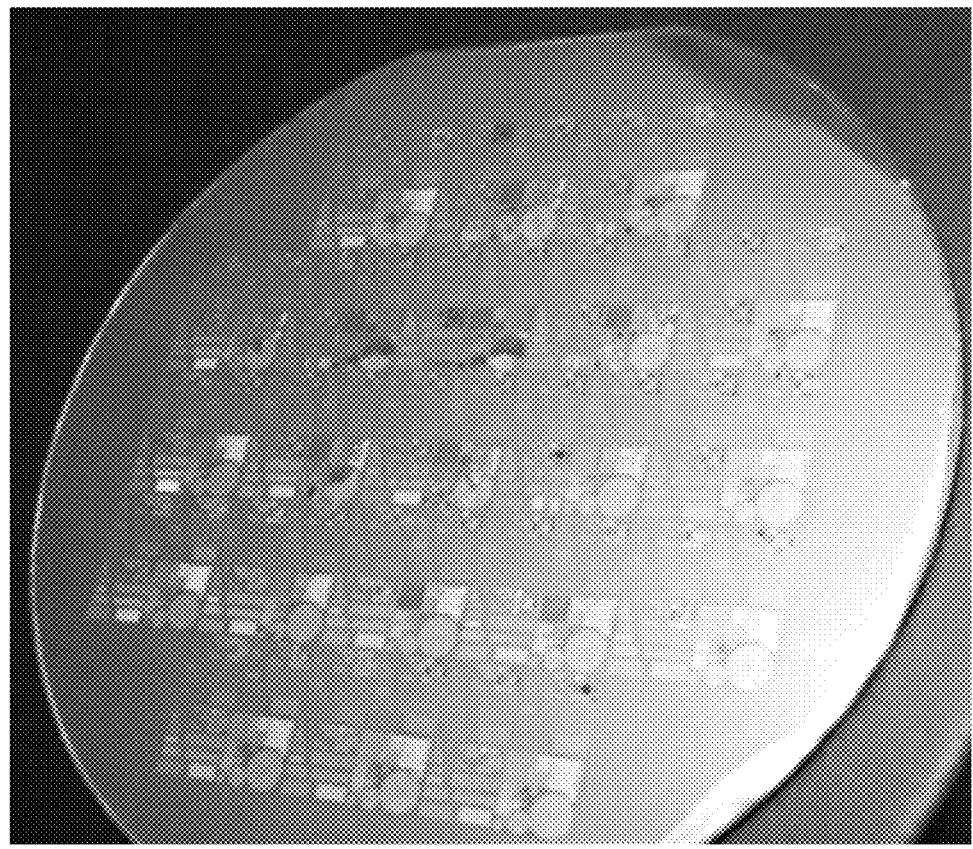
FIG. 1 shows a photograph of an embodiment of this invention.

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

Thus, in accordance with the practice of this invention there is provided a method of fabricating a semiconductor device comprising:

forming a first polymer layer over a surface of a first substrate where said polymer layer comprises a thermally stable and crosslinkable polymer, a crosslinking agent, and a surface energy modifier additive;

forming a second polymer layer over a surface of a second substrate where second polymer comprises a thermally stable and cross-linkable polymer and a crosslinking agent;

bonding thermally said surface of first substrate with said surface of second substrate at a first temperature, said first temperature being lower than a crosslinking temperature of said crosslinking agent;

subjecting said bonded substrates to a second temperature so as to allow crosslinking of said first polymer on first substrate with said second polymer on said second substrate, said second temperature being higher than said first temperature; and debonding said first substrate from said second substrate at room temperature by applying a mechanical force.

It should be noted that this invention provides certain hitherto unavailable advantages.

Specifically, among various advantages that may be attainable by this invention, the method of this invention provides for a temporarily bonding two or more wafers such that the bonded stack has sufficient thermal, mechanical and chemical stability for semiconductor device fabrication processing (elevated temperatures, mechanical forces, chemical exposure, vacuum exposure), while at the same time one is able to debond the wafers at room temperature using a mechanical force to pry the wafers apart. In addition, it is further contemplated that by using the method of this invention it is now possible to have little or no residue on the device wafer after debonding. Even more specifically, the method of this invention provides an efficient (acceptable throughput), easy to use (for example one layer or at most two layers of the bonding composition as disclosed herein, and no special or unusual equipment required), and cost-effective way to fabricate a semiconductor device.

Advantageously, the method of this invention does not require any special equipment to fabricate the semiconductor device. For example, U.S. Pat. No. 7,988,807 discloses a method, which not only requires a special laser and a glass (more expensive than silicon wafer) carrier wafer, i.e., a support substrate in order to release the adhesive layer, but also the support substrate needs to be thinned by a grinding process before releasing the device wafer substrate. On the other hand, the method of this invention provides a simpler cost effective process avoiding these undesirable steps.

Similarly, U. S. Patent Application Publication No. US2011/0069467 A1 discloses a process wherein a support wafer patterned with a release layer on most of the wafer surface except at the edge of the wafer. Room temperature debonding is performed by chemical removal (solvent dissolution) of the polymer at wafer edge followed by mechanical debonding from the release layer. The chemical removal step can be slow. An additional chemical removal (special solvent) step is required after debonding to remove the adhesive layer on the device wafer. Because of the solvents used, a special (more expensive) dicing tape is required. As this process requires solvent removal, the polymer cannot be crosslinked and thus is likely to flow in response to the wafer stress that occurs during heating.

Various other methods have also been disclosed in the literature which may also be disadvantageous for the economical fabrication of the semiconductor devices contemplated herein. For example, Japanese laid open Patent No. JP05074719 B2 discloses a method which requires a special perforated (expensive) carrier wafer and slow chemical removal of the adhesive. As the process requires solvent removal, the polymer cannot be crosslinked and thus is likely to flow in response to the wafer stress that occurs during heating.

Finally, U. S. Patent Application Publication No. US2010/0043608 A1 discloses a method which uses polymer crosslinking but involves a complex method of applying a release layer using plasma-enhanced deposition onto a wafer. This requires a special equipment, thus rendering this method unsuitable for producing wafers cost effectively. Room temperature debonding is performed by delamination of the bonded wafers from the release layer. The device wafer must be cleaned after debonding.

Accordingly, it is evident from the foregoing the instant method of the present invention provides heretofore unattainable results.

Accordingly, the method of the invention offers an adhesive composition comprising a thermally stable and cross-linkable polymer, an additive that interacts with the wafer surface to reduce its surface energy enabling room temperature debonding of said polymer from the wafer.

In addition, the thermally stable polymer as employed herein readily crosslinks at relatively lower temperatures and does not flow while fabrication of the devices, and counteracts the thermal stress encountered during device fabrication. Advantageously, the crosslinking additives are activated at temperatures above the wafer bonding temperature enabling void free wafer bonding.

Advantageously, it has also been found that the first and the second polymer layers as described herein can be suitably applied onto a first substrate (generally a device wafer substrate but a carrier wafer substrate can be used in some embodiments) and then bonded to a second substrate (generally a glass wafer, i.e., a carrier wafer but a device wafer can be used in some other embodiments where a bi-layer film is formed on a carrier wafer). Accordingly, in one of the embodiments, a bi-layer film is formed on a first substrate by first forming a first polymer layer over a surface of a first substrate where said polymer layer comprises a thermally stable and crosslinkable polymer, a crosslinking agent, and a surface energy modifier additive. Then forming a second polymer layer over a surface of the aforementioned coated first substrate where second polymer comprises a thermally stable and cross-linkable polymer and a crosslinking agent. Then bonding thermally said first substrate with a second substrate at a first temperature, said first temperature being lower than a crosslinking temperature of said crosslinking agent. After bonding, subjecting said bonded substrates to a second temperature so as to allow crosslinking of said first polymer on first substrate with said second polymer on said second substrate, said second temperature being higher than said first temperature; and debonding said first substrate from said second substrate at room temperature by applying a mechanical force.

In another embodiment there is also provided a method which encompasses forming a bi-layer film on a first substrate by first forming a first polymer layer over a surface of a first substrate where said polymer layer comprises a thermally stable and crosslinkable polymer, a crosslinking agent, and a surface energy modifier additive. Then forming a second polymer layer over a surface of the aforementioned coated first substrate where second polymer comprises a thermally stable and cross-linkable polymer and a crosslinking agent. Further forming a second polymer layer over a surface of a second substrate where second polymer comprises a thermally stable and cross-linkable polymer and a crosslinking agent. Then bonding thermally said first substrate with said second substrate at a first temperature, said first temperature being lower than a crosslinking temperature of said crosslinking agent. After bonding, subjecting said bonded substrates to a second temperature so as to allow crosslinking of said first polymer on first substrate with said second polymer on said second substrate, said second temperature being higher than said first temperature; and debonding said first substrate from said second substrate at room temperature by applying a mechanical force. Thus in this aspect of the invention the first substrate (which is generally a device wafer) contains a bi-layer film, i.e., both a release layer and an adhesive layer as described herein and the second substrate (which is generally a carrier wafer) contains only an adhesive layer.

It should be noted that in any of the aforementioned embodiments the first and second substrates can either be a carrier wafer or a device wafer. Accordingly, in one of the embodiments the first substrate is a carrier wafer and the second substrate is a device wafer. In another embodiment the first substrate is a device wafer and the second substrate is a carrier wafer.

In one embodiment, the surface energy modifier additive is mixed with a thermally stable polymer in an appropriate solvent and spin coated on a carrier wafer, which acts as a release layer. In a separate formulation, crosslinking additive is mixed with a thermally stable and cross-linkable polymer in an appropriate solvent and spin coated on device wafer or alternately as a second layer on top of the release layer. The wafers are then thermally bonded, at temperature lower than crosslinking temperature for void free bonding. The adhesive in the bonded wafers is then thermally cured (crosslinked) at a temperature greater than bonding temperature. The carrier wafer can be debonded at room temperature from the adhesive-carrier wafer interface due to the presence of the surface energy modifier in the release layer. Then the remaining film can be peeled from the device wafer.

Various cross-linkable polymers known in the literature can be employed in the method of this invention. Such cross-linkable polymers generally feature a cross-linkable functional group such as a double bond and the like to effect crosslinking with a cross-linking agent. An example of such cross-linkable polymer without any limitation includes certain of the copolymers of styrene with diene monomers, such as butadiene or isoprene, among others. Several of such polymers are commercially available. For example, STYROLUX® 3G55 (a styrene-butadiene copolymer commercially available from Styrolution, $T_g$~100° C.) or STYROFLEX® 2G66 (a styrene-butadiene block copolymer, also commercially available from Styrolution, $T_g$~100° C.), can be employed in the method of this invention among various other known cross-linkable polymers. Another series of styrene-diene block polymers are available under the trade name Kraton®. An example of a surface energy modifier additive that can be used in the method of this invention include without any limitation n-octadecyltrichlorosilane (OTS) or a copolymer of polyether modified polydimethylsiloxane (sold under the trade name BYK-333 or BYK-378 from BYK USA Inc.).

The aforementioned styrene-butadiene (or isoprene) copolymers can be either random copolymers or block polymers. The block polymers can be either diblock or tri-block polymers with a styrene, butadiene and styrene blocks. Other crosslinkable polymers that can be employed in the method of this invention include various other copolymers with unsaturated dienes, such as for example, polymers made from ethylene, propylene and diene monomers (EPDM), which still contain some unsaturated bonds in their backbone and available for crosslinking. It is well known that such diene monomers include without any limitation butadiene, isoprene, dicyclopentadiene (DCPD), ethylidene norbornene and vinyl norbornene, among others. The diene addition, for example butadiene or isoprene, with styrene can be either 1,2- or 1,4-addition.

Any of the cross-linking agents known in the literature can be used in the method of this invention. Non-limiting examples of such peroxide crosslinking initiators include the following in increasing reactivity as defined by their respective temperatures of 0.1 Hr half life: dicumyl peroxide (DCP) 154° C., di(tert-butylperoxyisopropyl) benzene (BPIB) 156° C., 3,3,5,7,7-pentamethyl-1,2,4-trioxepane (sold under the trade name of TRIGONOX® 311 from Akzo Nobel) 170° C. and 3,6,9-triethyl-3,6,9,-trimethyl-1,4,7-triperoxonane (sold under the trade name of TRIGONOX® 301 from Akzo Nobel) 185° C.

It has now been found that, a cross-linkable polymer with a modulus of 0.001 GPa to 1 GPa and $T_g$ of 40° C. to 150° C. in conjunction with 0.1 to 20 parts per hundred parts of the resin (PHR) of a peroxide initiator with an initiation temperature at least 20° C. above the $T_g$ of the cross-linkable polymer is suitable for the method of this invention. That is, 0.1 to 20 parts of aforementioned peroxide initiator used in conjunction with 100 parts of the thermally stable and cross-linkable polymer provides advantageous benefits for the method of this invention. By incorporating suitable amounts of thermally stable polymer into the release layer composition as well as adhesive layer composition the thermally stable polymer on the first and second substrates does not flow during bonding process as well as curing process, i.e., during crosslinking step, and during the thinning step.

As noted, various known cross-linkable polymers can be used in the method of this invention. Non-limiting examples of other cross-linkable polymers include various other styrene-diene copolymers and block polymers either commercially available or reported in the literature including such commercial vendors as Styrolution or Kraton Polymers.

Similarly, any of the peroxide initiators known in the literature which bring about the intended effect can be used in the method of this invention including but not limited to any organic peroxides, other than those mentioned herein and specifically used in the working examples that follow hereafter. Generally, as noted earlier, any peroxide having a temperature of 0.1 Hr half life ranging from 154° C. to 185° C. can be used. Such peroxide examples include but not limited to tert-butyl cumyl peroxide (sold under the trade name TRIGONOX T 159° C.), 1,1,3,3-tetramethylbutyl hydroperoxide (sold under the trade name TRIGONOX TMBH-L 180° C.) and isopropylcumyl hydroperoxide (sold under the trade name TRIGONOX M-55 183° C.). Various other peroxide initiators are also sold under the trade name TRIGONOX which may be suitable for use in the method of this invention. In other embodiments of this invention various other peroxide initiators which feature temperatures of 0.1 Hr half life slightly outside of the range of 154° C. to 185° C. can also be used.

As used herein "the surface energy modifier" means a material that alters the surface energy of a surface such that the surface can be releasably coated with an organic polymer. That is to say, the surface energy of an original surface is modified to both increase the hydrophobicity, and/or control the degree of the oleophobicity, of the surface. Further, such surface modification is believed to provide enhanced organic character to the surface to allow for coating with an organic polymer. Exemplary surface energy modifier materials include, but are not limited to, octadecyltrichlorosilane, octadecylmethoxydichlorosilane, octadecyltrimethoxysilane, dodecyltrimethoxysilane, dodecyldichloromethoxysilane, dodecyltrichlorosilane and polyether-modified polydimethylsiloxanes, sold under the trade names BYK®-333 or BYK"-378 from BYK USA Inc., or BYK Japan KK. Various other surface energy modifiers that provide a strong reduction of surface tension can also be used in the method of this invention. Several such surface energy modifiers are manufactured by BYK USA Inc. or BYK Japan KK, among others.

Generally, the carrier substrate is either a glass wafer or a silicon wafer which is bonded to second substrate which is a semiconductor substrate, such as a silicon wafer in accordance with the method of this invention. Accordingly, in one of the embodiments the method of this invention encompasses a first substrate which is a carrier wafer and the second substrate is a device wafer.

Generally, a release layer is applied onto a carrier wafer and the adhesive layer is applied onto a device wafer. Accordingly, in one of the embodiments the method of this invention encompasses a first polymer layer which is a release layer and the second polymer layer which is an adhesive layer.

The first and second polymer layers as disclosed herein can be applied to any of the desirable substrates using any of the techniques known in the art. With regard to said application, any appropriate coating method can be employed, for example spin coating, spraying, doctor blading, meniscus coating, ink jet coating and slot coating.

In another embodiment the method of this invention encompasses a first polymer composition which features both hydrophilic and hydrophobic properties. As noted earlier, the release layer composition which is generally used as a first polymer layer in the method of this invention contains a thermally stable and crosslinkable polymer and a surface energy modifier, thus featuring both hydrophobic and hydrophilic regions. Accordingly, in one of the embodiments of this invention the surface energy modifier provides hydrophobic as well as hydrophilic regions by way of polyether moieties imparting hydrophilic properties and polydimethylsiloxane imparting hydrophobic properties. That is to say, the surface energy modifier, such as for example, a polymeric surface energy modifier, can feature this property by way of proper selection of polymer backbone. On the other hand various other small molecule surface energy modifiers can also have these features by way of having hydrophilic groups such as halogen and alkoxy, and hydrophobic groups such as long chain alkyls in the same small molecule as exemplified herein. Accordingly, in another embodiment such hydrophilic properties are imparted by polyether or epoxy functional groups, again in the backbone of the surface energy modifier. Accordingly, by judicious selection of suitable thermally stable and crosslinkable polymer and surface energy modifier it is now possible to fabricate a semiconductor device in a cost-effective method of this invention.

As already noted above, any of the known thermally stable and cross linkable polymers can be employed in this invention which brings about the intended result. In one of the embodiments such exemplary polymers include the following: styrene-butadiene polymers, both random as well as block copolymers, as disclosed herein; and ethylene, propylene, diene monomer (EPDM) polymers, including such dienes as dicyclopentadiene (DCPD), ethylidene norbornene and vinyl norbornene, among others.

As also described above any of the crosslinking agents can be employed in the method of this invention, for example, a peroxide crosslinking agent. Non-limiting examples of such peroxide crosslinking agents include, dicumyl peroxide (DCP); di(tert-butylperoxyisopropyl) benzene (BPIB); 3,3,5,7,7-pentamethyl-1,2,4-trioxepane; and 3,6,9-triethyl-3,6,9,-trimethyl-1,4,7-triperoxonane.

Various known surface energy modifier additive can be employed in the method of this invention which include without any limitation the following: n-octadecyltrichlorosilane; dodecyltrichlorosilane; octadecylmethoxydichlorosilane; octadecyltrimethoxysilane; dodecyltrimethoxysilane; dodecyldichloromethoxysilane; a copolymer of polyether modified polydimethylsiloxane; a copolymer of polyether modified polysiloxane; a copolymer of polyether modified dimethylpolysiloxane; and mixtures in any combination thereof.

Generally, the bonding of the carrier substrate with a device substrate can be carried out at a first temperature which brings about such an effect. For example, such first temperature can range from 130° C. to 210° C. In another embodiment such first temperature is in the range of from 150° C. to 190° C. However, any other suitable first temperature which is either lower or higher than the range may be used in some other embodiments.

As already noted above once the carrier substrate and the device substrate are bonded, the bonded substrates are subjected to a second temperature which is generally higher than the temperature used for bonding, i.e., the first temperature. Accordingly, in one of the embodiments the second temperature is in the range of from 190° C. to 280° C. Again, any other suitable temperature can be employed in order to ensure curing of the thermally stable and crosslinkable polymer.

In another embodiment the thermally stable crosslinkable polymer exhibits a modulus of from 0.001 GPa to 1 GPa and glass transition temperature ($T_g$) of from 40° C. to 150° C.

Aforementioned formulations for coating a wafer can be prepared using any of the known solvents. An example of such a solvent without any limitation is mesitylene.

In another embodiment there is further provided a semiconductor device produced by the method of this invention.

In another embodiment there is further provided a method of fabricating a semiconductor device comprising:

forming a release layer over a surface of a carrier wafer substrate where said release layer comprises a thermally stable and crosslinkable polymer, a crosslinking agent, and a surface energy modifier additive;

forming an adhesive layer over a surface of a device wafer substrate where said adhesive layer comprises a thermally stable and cross-linkable polymer, and a crosslinking agent;

bonding thermally said surface of carrier wafer substrate with said surface of device wafer substrate at a first temperature in the range of from 140° C. to 190° C.;

subjecting said bonded substrates to a second temperature in the range of from 190° C. to 210° C. so as to allow crosslinking of said crosslinkable polymer on carrier substrate with said crosslinkable polymer on said wafer substrate; and debonding said carrier substrate from said device wafer substrate at room temperature by applying a mechanical force.

In this aspect of the method of the invention any of the thermally stable and cross linkable polymer as disclosed herein can be used, such as for example, styrene-butadiene copolymer. Again, any of the peroxide crosslinking agent can be employed in the embodiment of this invention. An example of such peroxide crosslinking agent used in this embodiment include without any limitation the following: dicumyl peroxide; di(tert-butylperoxyisopropyl) benzene; 3,3,5,7,7-pentamethyl-1,2,4-trioxepane; and 3,6,9-triethyl-3,6,9,-trimethyl-1,4,7-triperoxonane. Further, any of the surface energy modifier additives as disclosed can be employed in this embodiment, which include without any limitation the following: n-octadecyltrichlorosilane; dodecyltrichlorosilane; octadecylmethoxydichlorosilane; octadecyltrimethoxysilane; dodecyltrimethoxysilane; dodecyldichloromethoxysilane; a copolymer of polyether modified polydimethylsiloxane; a copolymer of polyether modified polysiloxane; a copolymer of polyether modified dimethylpolysiloxane; and mixtures in any combination thereof.

It should further be noted that in this aspect of the invention the carrier wafer can also be formed by coating with both a first polymer composition (release layer composition) and a second polymer composition (adhesive layer composition) to form said bi-layer film containing Do the first polymer layer and the second polymer layer. Then such a wafer containing bi-layer film can be bonded with a device wafer. In a further aspect of this invention said bi-layer film containing carrier wafer can also be bonded to a device wafer which is also coated with a second polymer layer as described herein. Accordingly, all of such variations are within the scope of this invention.

In another embodiment there is further provided a semiconductor device produced by the any one of the embodiments of this invention.

Finally, in another aspect of this invention there is also provided a method of fabricating a semiconductor device comprising:

forming a first polymer layer over a surface of a first substrate where said polymer layer comprises a thermally stable polymer and a surface energy modifier additive;

forming a second polymer layer over a surface of a second substrate where second polymer comprises a thermally stable and cross-linkable polymer and a crosslinking agent;

bonding thermally said surface of first substrate with said surface of second substrate at a first temperature said temperature being lower than a crosslinking temperature of said crosslinking agent;

subjecting to a second temperature so as to allow curing of said first polymer on first substrate with said second polymer on said second substrate, said second temperature being higher than said first temperature; and debonding said first substrate from said second substrate at room temperature by applying a mechanical force.

In another embodiment of this invention the method of the aforementioned embodiment further encompasses forming a second polymer layer over a surface of said first substrate coated with said first polymer before bonding said first substrate with said second substrate.

In this embodiment, the crosslinking agent and surface energy modifier additives are mixed with a thermally stable and cross-linkable polymer in an appropriate solvent and spin coated on a carrier wafer. In a separate formulation, crosslinking additive is mixed with a thermally stable and cross-linkable polymer in an appropriate solvent and spin coated on device wafer or alternately as a second layer on top of the release layer. The wafers are then thermally bonded at temperature lower than crosslinking temperature for void free bonding. The adhesive in the bonded wafers is then thermally cured at a temperature greater than the bonding temperature, said temperature being sufficiently high to activate the crosslinking additive resulting in the cross-linking of the polymer. The carrier wafer can be debonded at room temperature from the adhesive-carrier wafer interface due to the presence of the surface energy modifier in the release layer. Then the remaining film can be peeled from the device wafer.

In this aspect of the method of this invention, any of the thermally stable polymers as described herein can be employed which can sustain the conditions employed herein. That is to say that the thermally stable polymers which are compatible and can readily bond with the thermally stable and crosslinkable polymers can be used. Thus, any of the thermally stable polymers, such as styrene-diene copolymers and EPDM polymers can be used in this aspect of the invention. All of the surface energy modifiers and the crosslinking agents as described herein can be employed in this aspect of the invention.

This invention is further illustrated by the following examples which are provided for illustration purposes and in no way limit the scope of the present invention.

Example 1

Thermally Stable Polymer Composition

STYROLUX 3G55 (40 g) (a styrene-butadiene copolymer from Styrolution) was dissolved in mesitylene (60 g) resulting in a solution having total solids content of 40 wt. % (TS 40%). The formulation was mixed on a bench top roller (Wheaton brand) for 48 hours followed by filtration through a 5 μm filter.

Examples 2-5

Adhesive Layer Formulation

The polymer solution from Example 1 was used to form four different formulations, Examples 2-5 containing different amounts of dicumyl peroxide (DCP by Sigma Aldrich). In each of these Examples 2-5 specified amounts of DCP were added to specified amounts of Example 1 to form formulations of Examples 2-5. Each of the formulation, Examples 2-5, so formed was allowed to mix on a bench top roller (Wheaton brand) for an additional period of 24 hrs. The amount of DCP added is represented in terms of parts per hundred parts of resin (PHR), i.e., STYROLUX 3G55. Specifically, formulations with DCP loadings of 0.1 PHR (Example 2), 0.5 PHR (Example 3), 1 PHR (Example 4) and 10 PHR (Example 5) were prepared as follows:

Example 2: 0.016 g of DCP was added to 40 g of 3G55/Mesitylene (TS=40 wt. %)

Example 3: 0.08 g of DCP was added to 40 g of 3G55/Mesitylene (TS=40 wt. %)

Example 4: 0.16 g of DCP was added to 40 g of 3G55/Mesitylene (TS=40 wt. %)

Example 5: 1.6 g of DCP was added to 40 g of 3G55/Mesitylene (TS=40 wt. %)

The formulations thus formed in Examples 2-5 were used to form the adhesive layers in the following Examples.

Example 6

Release Layer Formulation with STYROLUX 3G55/BYK-378

STYROLUX 3G55 (20 g) was dissolved in 80 g of mesitylene to provide a formulation containing total solid content of 20 wt. %. The formulation thus obtained was mixed on a bench top roller (Wheaton brand) for 48 hours, followed by filtration through 5 μm filter. To 40 g of this formulation was then added 0.16 g of BYK-378 (from BYK USA Inc.) using a micro-syringe (B-D® 5 cc with LUER-LOK®), which resulted in 2 PHR of BYK-378 in the formulation (PHR=parts per hundred parts resin). The formulation was then placed on a bench top roller (Wheaton brand) for 24 hours. No gelation was observed after mixing, indicating good uniformity.

Example 7

Wafer Coating with Release Layer

The formulation from Example 6 (5 g) was hand dispensed from a bottle onto the center of a 4-inch silicon wafer mounted on a CEE-spinner (CB-100 from Brewer Science). The spin coating was performed in 2 stages. In the first (spreading) stage, the spinner was ramped up from 0 rpm to 500 rpm and allowed to stay at 500 rpm for 5 seconds for the formulation to spread out. In the second (coating) stage, the spinner speed was immediately ramped up to 2000 rpm at a rate of 1000 rpm/second and was kept at 2000 rpm for 30 seconds to achieve a uniform coating. Immediately after the spin coating, the wafer was transferred to a hot plate (CB-100 from Brewer Science) for soft bake at 120° C. for 5 min to remove any residual solvent. The film was then scratched manually with a standard 012-HD type razor blade to the wafer surface near the wafer center. Using a Veeco Dektak 150 profiler, a single thickness measurement was performed. The measured thickness was 3 μm.

Example 8

Device Wafer Coating with Release Layer

The formulation of Example 6 (5 g) was used in this Example 8 to coat a 4-inch silicon wafer with 5 μm tall copper bumps substantially using the procedures as set forth in Example 7. The measured thickness was 3 μm.

Example 9

Device Wafer Coating with Release Layer

The formulation of Example 6 (5 g) was used in this Example 9 to coat a 4-inch silicon wafer with 5 μm tall copper bumps substantially using the procedures as set forth in Example 7 except that in the spreading stage, the spinner speed was increased to 800 rpm at a rate of 1000 rpm/second and was kept at 800 rpm for 30 seconds to achieve coating thickness uniformity. The measured thickness was 15 μm.

Example 10

Device Wafer Coating with Release and Adhesive Layers

Formulation of Example 4 (5 g) was used to coat a wafer obtained from Examples 7, and using substantially the coating procedures as set forth in Example 7. The measured thickness of the bi-layer film was 53 μm, which is the total thickness of release layer and the adhesive layer.

Example 11-12

Device Wafer Coating with Release and Adhesive Layers

The same coating procedures were substantially repeated in Examples 11 and 12 to make bi-layer films on bumped wafers obtained from Examples 8 and 9, and by employing the formulation of Example 4.

Example 13

Bonding Procedure

The 4-inch silicon wafer coated with 53 μm thick bi-layer film as described in Example 10 was bonded to a 4-inch glass wafer using a SB-6e substrate bonder (Suss MicroTec) at a temperature of 190° C. with a pressure of approximately 2-3 KN applied for 5 minutes in a vacuum ($10^{-3}$ mBar). The bonded sample was visually inspected for voids. Following bonding, a thermal stability test was performed by placing the bonded wafer stack on a hotplate at 260° C. for 30 min.

Examples 14-15

Procedures of Example 13 was substantially repeated in Examples 14 and 15 except that the coated wafers from Examples 11 and 12 were respectively employed in these Examples 14-15.

Examples 16-18

Debonding Procedure

To initiate room temperature debonding of the bonded stacked wafers from Examples 13-15, a standard 012-HD type razor blade was inserted in between the silicon wafer and glass wafer which caused the wafers to separate slightly. The bonded stack was then easily separated manually. The polymer film remained on the glass wafer and was easily peeled off. The results are summarized in Table 1.

TABLE 1

| Example No. | Release layer thickness (μm) | New voids after thermal stability test | Able to peel adhesive layer after debonding |
|---|---|---|---|
| Ex. 16 (Bare) | 3 | No | Yes |
| Ex. 17 (Bumped) | 3 | No | No, bumps were broken off |
| Ex. 18 (Bumped) | 15 | No | Yes |

It is apparent from the data presented in Table 1, the bi-layer film with 3 μm thick release layer from Example 17 could not be peeled off from the bumped wafer without breaking the copper bumps, whereas in Example 18 which had a release layer with a thickness of 15 μm was successfully peeled off the bumped wafer. This indicates that the thickness of the release layer is an important parameter in successful release depending upon the size of the bump or other structures present on the silicon wafer. Additionally, this example shows that polymers such as STYROLUX 3G55 in combination with BYK-378 are suitable for the release layer.

Example 19

(Formulation with STYROLUX 3G55/Di(Tert-Butylperoxyisopropyl) Benzene (BPIB) as Adhesive Layer)

Following the procedures substantially as set forth in Example 2, a formulation of containing STYROLUX 3G55, di(tert-butylperoxyisopropyl) (BPIB=1 PHR) was prepared by employing BPIB (0.16 g) (from Arcos Organics) STYROLUX 3G55/Mesitylene (100 g, TS=40 wt. %), followed by mixing on a bench top roller (Wheaton brand) for 24 hrs.

Example 20

(Formulation with STYROLUX 3G55/Di(Tert-Butylperoxyisopropyl) Benzene (BPIB) as Adhesive Layer)

A formulation of STYROLUX 3G55/BPIB=4 PHR was prepared substantially in a similar fashion by employing 0.64 g of BPIB.

Example 21

Device Wafer Coating—Release Layer

Formulation of Example 6 (5 g, STYROLUX 3G55 (TS=40%)/BYK-378=2 PHR) was coated on a 4-inch silicon wafer as a release layer substantially following the procedures as set forth in Example 7, except that in the spreading stage, the speed was increased to 4000 rpm at a rate of 1000 rpm/second and was kept at 4000 rpm for 30 seconds. The measured thickness was 20 µm.

Example 22

Device Wafer Coating—Adhesive Layer on Release Layer

Formulation of Example 19 (5 g) as an adhesive layer was then coated on the wafer from Example 21 substantially following the coating procedures as set forth in Example 7, except that in the spreading stage, the speed was increased to 2500 rpm at a rate of 1000 rpm/second and was kept at 2500 rpm for 30 seconds. The measured thickness was 50 µm, which is the total thickness of release layer and adhesive layer.

Example 23

Device Wafer Coating—Adhesive Layer on Release Layer

The same procedure was used to coat 30 µm thick adhesive layer of formulation of Example 20 on a 4-inch silicon wafer which had 20 µm thick release layer of formulation of Example 6.

Example 24

Carrier Wafer Coating—Adhesive Layer

Formulation of Example 19 (5 g) as an adhesive layer was coated on the 4-inch glass wafer substantially following the coating procedures as set forth in Example 7, except that in the spreading stage, the speed was increased to 1000 rpm at a rate of 1000 rpm/second and was kept at 1000 rpm for 30 seconds. The measured thickness was 50 µm.

Example 25

Carrier Wafer Coating—Adhesive Layer

The same procedure was used to coat 50 µm thick adhesive layer of formulation of Example 20 on a 4-inch glass wafer.

Example 26

Bonding

The bonding procedure as set forth in Example 13 was substantially repeated in this Example 26 except for employing the wafers obtained in Examples 22-25, and by employing EVG Wafer Bonder and by applying a pressure of 200 N. A wafer from Example 22 was bonded with a wafer from Example 24 and a wafer from Example 23 was bonded with a wafer from Example 25. In some cases, the wafers were placed in the bonder at 190° C. (no ramp) and in other cases, the wafers were loaded at room temperature and heated to 190° C. before bonding pressure was applied.

Example 27

Debonding

Procedures as set forth in Example 16 was substantially repeated in this Example 27 by employing the bonded wafers of Example 26. The crosslinking of samples was checked by cutting a small piece from the debonded film, sonicating the film in tetrahydrofuran (THF) for 5 minutes, and visually observing the remaining film. The results are summarized in Table 2.

TABLE 2

| BPIB in adhesive (PHR) | Ramp | Voids | Able to debond | Cross-linked |
|---|---|---|---|---|
| 1[a] | No | None | No | Not tested |
| 1[a] | Yes | None | Yes | Yes |
| 4[b] | No | Some | No | Not tested |
| 4[b] | Yes | Some | Yes | Yes |

[a]wafer from Example 22 was bonded with a wafer from Example 24;
[b]wafer from Example 23 was bonded with a wafer from Example 25.

The above summarized results indicate the following about the processing condition and peroxide loading in formulations based on STYROLUX 3G55:
(1) When bonding at 190° C., ramping during bonding is required for the system to be debondable; and
(2) A working adhesive needs to be crosslinked and void-free, formulation loading of BPIB=1 PHR (Example 19) meets this requirement, whereas loading of BPIB=4 PHR (Example 20) does not.

Example 28

Release Layer Formulation of STYROFLEX 2G66/STYROLUX 3G55/BYK-378=2 PHR

Procedures as set forth in Example 6 were substantially followed except for employing a mixture of 7/1 weight ratio of STYROFLEX 2G66 (by Styrolution) and STYROLUX 3G55 (from Styrolution), which was prepared by dissolving respectively 35 g and 5 g of each polymer in a total of 60 g of mesitylene, making the total solids 40 wt. %. The formulation was mixed on a bench top roller (Wheaton brand) for 48 hours, followed by filtration with 5 µm filter. Then 0.32 g of BYK-378 (from BYK USA Inc.) was added to 40 g of the aforementioned 2G66/3G55 (7/1) formulation using a micro-syringe (B-D® 5 cc with Luer-Lok®). The formulation was then placed on a bench top roller (Wheaton brand) for 24 hrs. No gelation was observed after mixing, indicating good uniformity.

Example 29

(Adhesive Layer Formulation of STYROFLEX 2G66/STYROLUX 3G55 (7/1)/BPIB=1, 2, 4 PHR)

Three formulations of 2G66/3G55 (7/1 weight ratio) with BPIB at 1, 2, and 4 PHR were prepared by adding 0.16 g, 0.32 g and 0.64 g of BPIB (from Arcos Organics) to 40 g each of formulation from Example 28, followed by mixing on a bench top roller (Wheaton brand) for 24 hrs.

Example 30

Wafer Coating

The formulations from Examples 28 and 29 were employed to respectively coat 4-inch silicon wafers and glass wafers substantially using the procedures as set forth in Example 7.

Example 31

Bonding

The coated silicon and glass wafers from Example 30 were bonded together employing substantially the procedures as set forth in Example 13.

Example 32

Debonding

Procedures as set forth in Example 16 was substantially repeated in this Example 32 by employing the bonded wafers of Example 31. The results are summarized as follows:
(a) Directly loading a sample at 190° C. before bonding resulted in void-free after bonding (STYROFLEX 2G66/STYROLUX 3G55/BPIB=2 PHR), but another sample had some voids (STYROFLEX 2G66/STYROLUX 3G55/BPIB=4 PHR). However neither sample could be debonded.
(b) Loading a sample at ambient temperature and then ramping to 190° C. resulted in void-free after bonding (STYROFLEX 2G66/STYROLUX 3G55/BPIB=1 and PHR), but another sample had some voids (STYROFLEX 2G66/STYROLUX 3G55/BPIB=4 PHR). All three samples were debonded easily and were crosslinked.

These results indicate the following about the processing condition and peroxide loading in formulations based on mixture of STYROFLEX 2G66/STYROLUX 3G55 (7/1):
(1) When bonding at 190° C., ramping during bonding is required for the system to be debondable;
(2) A working adhesive needs to be crosslinked and void-free, formulation loading of BPIB=1 PHR and 2 PHR meet this requirement, whereas loading of BPIB=4 PHR under these conditions does not.

Example 33

Release Layer Formulation with STYROFLEX 2G66/STYROLUX 3G55/BPIB/BYK-378=2, 4 & 8 PHR A formulation of STYROFLEX 2G66/STYROLUX 3G55 (7/1 weight ratio)/BPIB=2 PHR/BYK378=2 PHR was prepared substantially following the procedures as set forth in Example 6 by adding 0.32 g of BPIB (from Arcos Organics) and 0.32 g of BYK-378 (from BYK USA Inc.) to 40 g of STYROFLEX 2G66/STYROLUX (7/1 weight ratio) in mesitylene (TS=40 wt. %), followed by mixing on a bench top roller (Wheaton brand) for 24 hrs. Formulations with 4 and 8 phr of BPIB were prepared similarly. These formulations were used as release layer coatings.

Example 34

(Adhesive Layer Formulation with STYROFLEX 2G66/STYROLUX 3G55 (7/1)/BPIB=2, 4 and 8 PHR)

Formulations of STYROFLEX 2G66/STYROLUX 3G55 (7/1 weight ratio) with BPIB at 1, 2, and 4 PHR were prepared by adding 0.16 g, 0.32 g and 0.64 g of BPIB (from Arcos Organics) to 40 g of STYROFLEX 2G66/STYROLUX 3G55 (7/1 weight ratio) in mesitylene (TS=40 wt. %), followed by mixing on a bench top roller (Wheaton brand) for 24 hrs. These formulations were used as adhesive layer coatings.

Example 35

Wafer Coatings

Procedures as set forth in Examples 7 and 10 were substantially repeated in this Example 35 to coat either a silicon wafer or a glass wafer using the formulations of Examples 33 and 34 to form wafers having desirable thickness of the films of adhesive and release layers.

Example 36

Bonding

The coated wafers from Example 36 were bonded using substantially the same procedure described in Example 26 except that temperatures of either 150° C. or 160° C. and a pressure of either 200 N or 300 N were applied. The same procedure was used to bond wafer pairs coated with an adhesive layer using the formulation of Example 34 and corresponding release layers using formulations of Example 33. After bonding, bonding voids were examined and select samples were baked at 200° C. on a hotplate for either 10 min or 20 min for additional crosslinking.

Example 37

Debonding

Debonding was attempted on all samples from Example 36 and crosslinking check was carried out for those samples that could be debonded, using the same procedure described in Example 27. The results are summarized in Table 3.

TABLE 3

| | Bonding condition | | | Bake | Bonding voids | | | |
| --- | --- | --- | --- | --- | --- | --- | --- | --- |
| BPIB, PHR | T, ° C. | Force, N | Time, min | time at 200° C. | Before bake | After bake | Debondable | cross-linked |
| 2 | 150 | 200 | 5 | 10 min | Y | N | Y | Y |
| | 150 | 300 | | 20 min | N | N | Y | Y |

TABLE 3-continued

| BPIB, PHR | Bonding condition | | | Bake time at 200° C. | Bonding voids | | Debondable | cross-linked |
|---|---|---|---|---|---|---|---|---|
| | T, ° C. | Force, N | Time, min | | Before bake | After bake | | |
| 4 | 150 | 200 | 10 min | | Y | N | Y | Y |
| | 150 | 300 | 20 min | | Y | N | Y | Y |
| 8 | 150 | 200 | 10 min | | Y | Delaminate | Y | Y |
| | 160 | 300 | 20 min | | Y | Delaminate | Y | Y |

These results indicate the following about the processing condition and peroxide loading in formulations based on mixture of STYROFLEX 2G66/STYROLUX 3G55 (7/1 weight ratio), as compared with bonding and debanding Examples 26 and 27:

(1) Bonding temperature can be lowered to 150° C. without ramping for the adhesive to be debondable;

(2) For BPIB loading of 2 PHR and 4 PHR, voids-free adhesive can be achieved by using post-bonding cure at 200° C. for 10 min or longer. However, loading of 8 PHR does not require post-bonding cure and, in fact, such a cure has negative effects;

(3) All formulations with BPIB loading of 2 PHR or above can be crosslinked with post-bonding cure.

Example 38

(Release Layer Formulation with STYROFLEX 2G66/STYROLUX 3G55 (7/1 Weight Ratio)/BYK-378=2 PHR/Trigonox 311=1,4,8 PHR)

A formulation of STYROFLEX 2G66/STYROLUX 3G55 (7/1 weight ratio)/Trigonox 311=1 PHR/BYK378=2 PHR was prepared by adding 0.16 g of Trigonox 311 (Akzo Nobel) and 0.32 g of BYK-378 (from BYK USA Inc.) to 40 g of STYROFLEX 2G66/STYROLUX 3G55 (7/1 weight ratio)/mesitylene (TS=40 wt. %), followed by mixing on a bench top roller (Wheaton brand) for 24 hrs. Formulations with 4 and 8 PHR of Trigonox 311 were prepared similarly. These formulations were used as release layer coatings.

Example 39

(Adhesive Layer Formulations with STYROFLEX 2G66/STYROLUX 3G55 (7/1 Weight Ratio)/TRIGONOX 311=1, 4, and 8 PHR Formulations of STYROFLEX 2G66/STYROLUX 3G55 (7/1 weight ratio) with BPIB at 1, 4, and 8 PHR were prepared by adding 0.16 g, 0.64 g and 1.28 g of Trigonox 311 (Akzo Nobel) to 40 g of STYROFLEX 2G66/STYROLUX 3G55 (7/1 weight ratio)/mesitylene (TS-40 wt. %), followed by mixing on a bench top roller (Wheaton brand) for 24 hrs. These formulations were used as adhesive layer coatings.

Example 40

Wafer Coating

Procedures as set forth in Examples 7 and 10 were substantially repeated in this Example 40 to coat either a silicon wafer or a glass wafer using the formulations of Examples 38 and 39 to form wafers having desirable thickness of the films of adhesive and release layers. In general, the desired coating thicknesses included a 20 μm thickness of formulations of Example 38 as release layer on silicon wafers and a 30 μm thickness of formulations of Example 39 as an adhesive layer on top of the release layer as well as a 50 μm thick adhesive layer on glass wafer using the formulations of Example 39.

Example 41

Bonding

The same bonding procedure as described in Example 26 was substantially used to bond the wafers from Example 40. In each of the bonding step a coated silicon wafer having a bi-layer film of release layer and an adhesive layer as described in Example 40 was bonded with a coated glass wafer as described in Example 40. Each of the bonded sample was visually inspected for voids. The wafer stack was placed on a hotplate at 200° C. for 10 min for additional crosslinking.

Example 42

Debonding

The same debonding procedure described in Example 27 was substantially used to debond the bonded wafers from Example 41. Degree of crosslinking was qualitatively judged by how the debonded film dissolves: Uncrosslinked samples dissolves instantly, slightly crosslinked samples swell, and heavily crosslinked samples stay intact. Debonded film containing 1 PHR of Trigonox 311 was not crosslinked, film containing 4 PHR had a low degree of crosslinking and 8 PHR had a medium degree of crosslinking.

Example 43

(Release Layer Formulation with STYROFLEX 2G66/STYROLUX 3G55 (7/1 Weight Ratio)/BYK-378=2 PHR/TRIGONOX301=4 and 8 PHR A formulation of STYROFLEX 2G66/STYROLUX 3G55 (7/1 weight ratio)/Trigonox 301=4 PHR/BYK-378=2 PHR was prepared by adding 0.64 g of Trigonox 301 (Akzo Nobel) and 0.32 g of BYK-378 (BYK USA Inc.) to 40 g of STYROFLEX 2G66/STYROLUX 3G55 (7/1 weight ratio)/mesitylene (TS=40 wt. %), followed by mixing on a bench top roller (Wheaton brand) for 24 hrs. Formulations with 8 PHR of Trigonox 301 were prepared similarly. These formulations were used as release layer coatings.

Example 44

(Adhesive Layer Formulations with STYROFLEX 2G66/STYROLUX 3G55 (7/1 Weight Ratio)/TRIGONOX 311=4 and 8 PHR)

Formulations of STYROFLEX 2G66/STYROLUX 3G55 (7/1 weight ratio) with BPIB at 4 and 8 PHR were prepared by adding 0.64 g and 1.28 g of Trigonox 301 (Akzo Nobel) to 40 g of STYROFLEX 2G66/STYROLUX 3G55 (7/1 weight ratio)/mesitylene (TS=40 wt. %), followed by mixing on a bench top roller (Wheaton brand) for 24 hrs. These formulations were used as adhesive layer coatings.

Example 45

Wafer Coating

Procedures as set forth in Examples 7 and 10 were substantially repeated in this Example 45 to coat either a silicon wafer or a glass wafer using the formulations of Examples 43 and 44 to form wafers having desirable thickness of the films of adhesive and release layers. In general, the desired coating thicknesses included a 20 µm thickness of formulations of Example 43 as release layer on silicon wafers and a 30 µm thickness of formulations of Example 44 as an adhesive layer on top of the release layer as well as a 50 µm thick adhesive layer on glass wafer using the formulations of Example 44.

Example 46

Bonding

The same bonding procedure as described in Example 26 was substantially used to bond the wafers from Example 45. The bonded sample was visually inspected for voids. The wafer stack was placed on a hotplate at 200° C. for 10 min for additional crosslinking.

Example 47

Debonding

The same debonding procedure described in Example 27 was substantially used to debond the bonded wafers from Example 46. Degree of crosslinking was qualitatively judged by how the debonded film dissolves: Uncrosslinked samples dissolves instantly, slightly crosslinked samples swell, and heavily crosslinked samples stay intact. Debonded films containing 4 and 8 PHR Trigonox 301 were well-crosslinked. It is further evident form this study a proper selection of the formulation and the level of cross-linking agent provide the most suitable result. In general, it was found that a cross-linkable formulation that contains a sufficiently high loading of cross-linking additive that is cross-linked at a temperature above that needed to bond the polymer in a void-free manner is suitable in the method of this invention.

Example 48

(Thinned Through-Silicon Via (TSV) Wafer)

Step 1: Oxide Mask Deposition and Patterning

A 500 nm thick plasma enhanced chemical vapor deposition (PECVD) silicon oxide is deposited as an etch mask on a 500 µm thick blank silicon wafer using the IPE-1000 PECVD tool. The deposition conditions are as follows; radio frequency (RF) power at 400 KHz frequency: 100 W, $SiH_4$ flow rate: 18 standard cubic centimeters per minute (sccm), $N_2O$ flow rate: 1800 sccm, temperature: 200° C., pressure: 1.4 Torr, deposition time: 10 min.

Approximately 1 mL of 1,1,1,3,3,3-hexamethyldisilazane (HMDS) was dispensed using a transfer pipette (3 mL) onto the center of a 4-inch silicon wafer center mounted on a CEE-spinner from Brewer Science. After dispense was completed, the wafer was ramped at a rate of 4000 rpm/sec to 4000 rpm. After 45 sec, wafer rotation was stopped and the wafer put onto a hot plate (CEE-6000) at 205° C. for 1 min. Approximately 1 mL of 1813 photoresist (Shipley) was dispensed using a transfer pipette (3 mL) onto the center of a 4-inch silicon wafer center mounted on a CEE-spinner from Brewer Science. After dispense was completed, the wafer was ramped at a rate of 1000 rpm/sec to 3500 rpm. After 45 sec, wafer rotation was stopped and the wafer put onto a hot plate (CEE-6000) at 115° C. for 1 min. The wafer was then exposed using ABM mask contact aligner at a radiation dose of 10 $mW/cm^2$. Using a Hamatech-Steag developer station, the wafer was developed in MIF 726 developer (AZ) for 1 min. A descum was performed in Oxford-80 tool using the conditions; radio frequency (RF) power at 13.56 MHz frequency: 150 W, 02 flow rate: 50 sccm, pressure: 60 mTorr, descum time: 30 sec. The PECVD was etched in Oxford-80 tool using the photoresist as the mask using a 2-step condition. The first step etch conditions are; radio frequency (RF) power at 13.56 MHz frequency: 240 W, dc etch bias: 119 V, $CHF_3$ flow rate: 50 sccm, 02 flow rate: 2 sccm, pressure: 40 mTorr, etch time: 5 min, temperature controller setting: 10° C. The second step etch conditions are; radio frequency (RF) power at 13.56 MHz frequency: 150 W, dc etch bias: 119 V, $CF_4$ flow rate: 30 sccm, pressure: 40 mTorr, etch time: 5 min, temperature controller setting: 10° C. Following PECVD oxide etch, the resist was stripped in Oxford-80 tool using the following conditions: Radio frequency (RF) power at 13.56 MHz frequency: 150 W, 02 flow rate: 50 sccm, pressure: 60 mTorr, etch time: 5 min.

Step 2: Si etching by DRIE

Using patterned PECVD oxide as the etch mask, 50 µm deep trenches were etched into the silicon wafer in Unaxis-770 deep Si etch tool using the following two step passivation-etch cycle conditions with a total of 90 cycles repeated; RF1 bias power: 0.1 W, $SF_6$ flow rate: 2 sccms, temperature controller setting: 22° C., RF2 power at 13.56 MHz: 850 W, $C_4F_8$ flow rate: 60 sccm, pressure: 24 mTorr, Ar flow rate: 40 sccm, He flow rate: 2.7 sccm, passivation time: 4.0 s, RF1 bias power: 8 W, $SF_6$ flow rate: 70 sccms, temperature controller setting: 22° C., RF2 power at 13.56 MHz: 850 W, $C_4F_8$ flow rate: 2 sccm, pressure: 23 mTorr, Ar flow rate: 40 sccm, He flow rate: 2.7 sccm, etch time: 2 s. The PECVD oxide etch mask was completely etched in Oxford-80 tool using a 2-step condition. The first step etch conditions are; radio frequency (RF) power at 13.56 MHz frequency: 240 W, dc etch bias: 119 V, $CHF_3$ flow rate: 50 sccm, $O_2$ flow rate: 2 sccm, pressure: 40 mTorr, etch time: 15 min, temperature controller setting: 10° C. The second step etch conditions are; radio frequency (RF) power at 13.56 MHz frequency: 150 W, dc etch bias: 119 V, $CF_4$ flow rate: 30 sccm, pressure: 40 mTorr, etch time: 3 min, temperature controller setting: 10° C.

Step 3: Oxide Liner Deposition

A 500 nm thick new coating of PECVD oxide was deposited using the IPE-1000 PECVD tool. The deposition conditions are as follows; radio frequency (RF) power at 400 KHz frequency: 100 W, $SiH_4$ flow rate: 18 standard cubic centimeters per minute (sccm), $N_2O$ flow rate: 1800 sccm, temperature: 200° C., pressure: 1.4 Torr, deposition time: 10 min.

Step 4: Sputter Seed Deposition

A 10 nm thick Ta layer followed by 200 nm Cu layer were deposited using CVC-601 dc magnetron sputter tool using the following conditions: dc power: 2000 W, Ar flow rate: 40 sccm, pressure: 19 mtorr, Ta deposition time: 0.6 min, Cu deposition time: 6 min.

Step 5: Cu Electroplating

50 μm thick Cu platting was performed in a bath using the following conditions; Pulsed power supply: 1100 mAh for 13.93 μm, 1600 mAh for 21.96 μm, Bath Composition: 2 gallons Enthone "Microfab SC Makeup", Replenish Bath: 90 mL $Cu_2SO_4$, 64 mL Microfab SC MD100, 16 mL Microfab SC LO, Forward On: 40 msec, Forward Off: 0 msec, Forward Duration: 40 msec, Reverse On: 2.3 msec, Reverse Off: 0 msec, Reverse Duration: 2.3 msec, Voltage: 4.6 V, Forward Current: 440 mA, Reverse Current: 880 mA.

Step 6: Cu CMP Conditions

Using a Straubaugh Model 6EC CMP tool the Cu overburden on wafer surface from the electroplating was polished down to the wafer surface using the following slurry and CMP conditions: Cabot Microelectronics slurry consisting of 14.8 parts M8540 to 1 part $H_2O_2$, down force: 8 psi, table rotation: 60 rpm, chuck rotation: 25 rpm, back pressure: −8 psi, slurry feed: 75 mL/min, polishing time: 20-30 min.

Step 7: Spin Coating & Wafer Bonding

To achieve 20 μm thick coating approximately 5 g of formulation from Example 28 (STYROFLEX 2G66/STYROLUX 3G55 (7/1 weight ratio) with BYK-378 at 2 PHR) was hand dispensed from the bottle onto the center of a silicon wafer having the through silicon vias (TSV) mounted with TSV surface top exposed on a CEE-spinner, CB-100 from Brewer Science. The spin coating was performed in two stages with no stopping in between: spreading stage and coating stage. In the first spreading stage, the spinner was ramped up from 0 rpm to 500 rpm and allowed to stay at 500 rpm for 5 seconds for the formulation to spread out. In the second coating stage, the spinner was immediately ramped up to 4000 rpm at a speed of 1000 rpm/second and was kept at 4000 rpm for 30 seconds to achieve coating thickness uniformity. Immediately after the spin coating, the wafer was transferred to a hot plate (CB-100 from Brewer Science) for soft bake at 120° C. for 5 min to remove any residual solvent.

To achieve 50 μm thick coating approximately 5 g formulation from Example 29 (STYROFLEX 2G66/STYROLUX 3G55 (7/1 weight ratio) with BPIB at 2 PHR) was hand dispensed from the bottle onto the center of a 4-inch glass wafer mounted on a CEE-spinner, CB-100 from Brewer Science. The spin coating was again performed in two stages with no stopping in between: spreading stage and coating stage. In the first spreading stage, the spinner was ramped up from 0 rpm to 500 rpm and allowed to stay at 500 rpm for 5 seconds for the formulation to spread out. In the second coating stage, the spinner was immediately ramped up to 1000 rpm at a speed of 1000 rpm/second and was kept at 1000 rpm for 30 seconds to achieve coating thickness uniformity. Immediately after the spin coating, the wafer was transferred to a hot plate (CB-100 from Brewer Science) for soft bake at 120° C. for 5 min to remove any residual solvent. To achieve additional 30 μm thick coating approximately 5 g formulation of Example 29 was hand dispensed from the bottle onto the center of the above coated glass wafer mounted on a CEE-spinner, CB-100 from Brewer Science. The spin coating was carried out essentially in the same manner in two stages with no stopping in between: spreading stage and coating stage. In the first spreading stage, the spinner was ramped up from 0 rpm to 500 rpm and allowed to stay at 500 rpm for 5 seconds for the formulation to spread out. In the second coating stage, the spinner was immediately ramped up to 2500 rpm at a speed of 1000 rpm/second and was kept at 2500 rpm for 30 seconds to achieve coating thickness uniformity. Immediately after the spin coating, the wafer was transferred to a hot plate (CB-100 from Brewer Science) for soft bake at 120° C. for 5 min to remove any residual solvent.

The polymer coated 4-inch glass wafer was then bonded to the polymer coated TSV Si wafer using an EVG 510 substrate bonder (EV Group). The TSV wafer was manually placed with polymer side facing up on the preheated bonder chuck that is set at bonding temperature. Bonder flags which act as wafer separator were manually inserted on top of the TSV wafer followed by placing the glass wafer with polymer coating facing the bottom on top of the flags. The bonder chamber was then closed followed by pumping to $10^{-6}$ mbar. The flags were then pulled away from the wafers resulting in intimate contact between the polymer surfaces of the 2 wafers. The bonding of the polymer stack was performed at a temperature of 150° C. with a force of 600 N applied for 5 minutes. The bonded samples were unloaded and were visually inspected and no voids were observed. Following bonding the bonded wafers were cross-linked on a hot plate at 200° C. for 10 min.

Step 8: Wafer Thinning Conditions

The Si wafer with TSVs was thinned down to expose the Cu TSVs using IPEC-472 CMP tool equipped with 3M Trizact diamond tile abrasive pads. The following slurry and CMP conditions are used: Cabot Microelectronics slurry consisting of ESF-NB diluted 1:10 with DI water, down force: 4.5 psi, platten rotation: 60 rpm, carrier rotation: 59 rpm, back pressure: 2.5 psi, thinning time: 20-30 min.

FIG. 1 shows the cross-linked polymer bonded wafer after thinning. It is quite evident that no delamination of the bonded stack was observed through the glass wafer, indicating sufficient adhesion of cross-linked polymer to the wafers to withstand the TSV stress.

Thermal Stability Test of Bonded Wafer

The cross-linked polymer bonded wafer after thinning was further tested for thermal stability at 220° C., $10^{-5}$ mbar for 30 min and no voids were observed through the glass wafer in the bonded wafers. This result further illustrates the ability of this cross-linked system to withstand stresses associated with thermal processes Comparative Example 1

SEPTON™2002 (20 g) (a hydrogenated styrene ethylene propylene styrene block polymer, styrene content: 30%, from Kuraray) was dissolved in mesitylene (80 g), making the total solid content of the solution 20 wt. %. The formulation was then filtered through a 6 μm filter (Pall, Type: HDCII, polypropylene). To this solution was added 0.2 g of BYK-378 (polyether modified dimethylpolysiloxane, from BYK USA Inc.) using a micro-syringe (B-D® 5 cc with Luer-Lok®), which resulted in a formulation containing 1 PHR of BYK-378. The formulation thus formed was then placed on a bench top roller (Wheaton brand) and mixed for 24 hours. No gelation was observed after mixing, indicating good uniformity.

Comparative Example 2

Comparative Example 1 was substantially repeated except for employing 0.4 g of BYK-378 (from BYK USA Inc.) and 20 g of SEPTON2002, which resulted in a formulation containing 2 PHR of BYK-378.

Comparative Examples 3-4

Formulation of Comparative Example 1 (5 g) was spun coated onto a 4-inch silicon wafer substantially following the procedures as set forth in Example 7. The measured thickness was 3 µm. This coating layer is the release layer as described herein.

The same coating procedure was substantially used in Comparative Example 4 except that the formulation of Comparative Example 2 was employed.

Comparative Examples 5-12

Formulation of Example 2 (5 g) was coated on the same wafer which was previously coated with a release layer as set forth in in Comparative Example 3. The spin coating in this Comparative Example 3 was substantially same as in Comparative Example 1 except that in the spreading stage, the spinner speed was increased to 1000 rpm at a rate of 1000 rpm/second and was kept at 1000 rpm for 30 seconds to achieve coating thickness uniformity. The measured thickness was 53 µm, which is the total thickness of release layer and adhesive layer. Thus the adhesive layer thickness was 50 µm.

The same coating procedure was substantially repeated in Comparative Examples 6-8 which respectively used the formulations of Comparative Example 3 as a release layer and formulations of Examples 3-5 as an adhesive layer.

Similarly, the same coating procedures were substantially repeated in Comparative Examples 9-12 in which the coated wafers contained formulation of Comparative Example 2 as a release layer and formulations of Examples 2-4 as an adhesive layer.

Comparative Example 13

Two 4-inch silicon wafers coated with 53 µm thick bi-layer film as described in Comparative Example 5 were separately bonded to a 4-inch glass wafer using a SB-6e substrate bonder (Suss MicroTec) at a temperature of 190° C. with a pressure of approximately 2-3 KN applied for 5 minutes for one sample and 10 minutes for the second sample in a vacuum ($10^{-3}$ mBar).

Additional bonded wafer stacks (two each) were prepared substantially in the same manner using the coated silicon wafers from Comparative Examples 6-12 and by employing bonding times of 5 minutes and 15 minutes.

Comparative Example 14

To initiate room temperature debonding of the bonded stacked wafers from Comparative Example 13, a standard 012-HD type razor blade was inserted in between the silicon wafer and glass wafer which caused the wafers to separate slightly. The bonded stack was then easily separated manually. The polymer film remained on the glass wafer and was easily peeled off. Crosslinking of samples was checked by cutting a small piece from the debonded film, sonicating the film in tetrahydrofuran (THF) for 5 minutes, and visually observing the remaining film. The results are summarized in Table 4.

TABLE 4

| Example No. | Release Layer: Septon2002 with: | Adhesive Layer: STYROLUX 3G55 with: | Bonding Time (min) | Voids after Bonding | Appearance after THF Soak |
|---|---|---|---|---|---|
| Comparative Example 5 | 1 phr BYK378 | 0.1 phr DCP | 5 | Some | Very swollen |
| Comparative Example 5 | | 0.1 phr DCP | 15 | Some | Very swollen |
| Comparative Example 6 | | 0.5 phr DCP | 5 | Some | Very swollen |
| Comparative Example 6 | | 0.5 phr DCP | 15 | Some | No change |
| Comparative Example 7 | | 1 phr DCP | 5 | Some | No change |
| Comparative Example 7 | | 1 phr DCP | 15 | Some | No change |
| Comparative Example 8 | | 10 phr DCP | 5 | many | No change |
| Comparative Example 8 | | 10 phr DCP | 15 | many | No change |
| Comparative Example 9 | 2 phr BYK378 | 0.1 phr DCP | 5 | Some | Very swollen |
| Comparative Example 9 | | 0.1 phr DCP | 15 | Some | Very swollen |
| Comparative Example 10 | | 0.5 phr DCP | 5 | Some | Very swollen |
| Comparative Example 10 | | 0.5 phr DCP | 15 | Some | No change |
| Comparative Example 11 | | 1 phr DCP | 5 | Some | No change |
| Comparative Example 11 | | 1 phr DCP | 15 | Some | No change |
| Comparative Example 12 | | 10 phr DCP | 5 | many | No change |
| Comparative Example 12 | | 10 phr DCP | 15 | many | No change |

It is quite apparent from the data presented in Table 4 all of the tested wafers showed some to many voids after bonding. Furthermore, the wafers bonded with the adhesive layer that had a higher loading of DCP had more voids than those with a lower loading of DCP, indicating higher degree of premature crosslinking.

It should be further noted that in the THF soak test, the uncrosslinked samples dissolve quickly, slightly crosslinked samples swell, and heavily crosslinked samples remain unchanged. Thus the THF soak test revealed the effect of bonding time and DCP loading on the degree of crosslinking, as described below:

(1) DCP loading ≥1 PHR: samples stayed intact after the test, indicating high degree of crosslinking, for both 5 min bonding and 15 min bonding;

(2) DCP loading=0.5 PHR: samples bonded for 15 min. stayed intact after the test, whereas samples bonded at 5 min was very swollen;

(3) DCP loading=0.1 PHR: both samples bonded for 5 min and 15 min became very swollen, indicating poor crosslinking.

Comparative Example 15

Thinned Through Silicon Wafer

The same process described in Example 48 was substantially performed except that a formulation of Comparative Example 1 was used (SEPTON 2002 with 1 PHR BYK-378). The coating process was as follows:

To achieve 55 µm thick coating approximately 5 g formulation of Comparative Example 1 was hand dispensed from the bottle onto the center of TSV Si wafer mounted with TSV surface top exposed on a CEE-spinner, CB-100 from Brewer Science. The spin coating was carried out in two stages with no stopping in between: spreading stage and coating stage. In the first spreading stage, the spinner was ramped up from 0 rpm to 500 rpm and allowed to stay at 500 rpm for 5 seconds for the formulation to spread out. In the second coating stage, the spinner was immediately ramped up to 500 rpm at a speed of 1000 rpm/second and was kept at 500 rpm for 35 seconds to achieve coating thickness uniformity. Immediately after the spin coating, the wafer was transferred to a hot plate (CB-100 from Brewer Science) for soft bake at 120° C. for 5 min to remove any residual solvent. To achieve additional 23 µm thick coating approximately 5 g of formulation of Comparative Example 1 was hand dispensed from the bottle onto the center of previously coated TSV Si wafer mounted on a CEE-spinner, CB-100 from Brewer Science. The spin coating was again carried out in two stages with no stopping in between: spreading stage and coating stage. In the first spreading stage, the spinner was ramped up from 0 rpm to 500 rpm and allowed to stay at 500 rpm for 5 seconds for the formulation to spread out. In the second coating stage, the spinner was immediately ramped up to 2300 rpm at a speed of 1000 rpm/second and was kept at 2300 rpm for 30 seconds to achieve coating thickness uniformity. Immediately after the spin coating, the wafer was transferred to a hot plate (CB-100 from Brewer Science) for soft bake at 120° C. for 5 min to remove any residual solvent.

To achieve 32 µm thick coating approximately 5 g of formulation of Comparative Example 1 was hand dispensed from the bottle onto the center of 4-inch glass wafer mounted on a CEE-spinner, CB-100 from Brewer Science. The spin coating was carried out in two stages with no stopping in between: spreading stage and coating stage. In the first spreading stage, the spinner was ramped up from 0 rpm to 500 rpm and allowed to stay at 500 rpm for 5 seconds for to the formulation to spread out. In the second coating stage, the spinner was immediately ramped up to 1500 rpm at a speed of 1000 rpm/second and was kept at 1500 rpm for 30 seconds to achieve coating thickness uniformity. Immediately after the spin coating, the wafer was transferred to a hot plate (CB-100 from Brewer Science) for soft bake at 120° C. for 5 min to remove any residual solvent.

The bonding of the polymer coated silicon wafer and the glass wafer was performed substantially using the same procedures as set forth in Example 48 except that a temperature of 190° C. with a force of 600 N applied for 5 minutes. The bonded samples are unloaded and were visually inspected and no voids were observed.

The Si wafer with through silicon vias (TSVs) was thinned down to expose the Cu TSVs using IPEC-472 CMP tool equipped with 3M Trizact diamond tile abrasive pads as described in Example 48 except for using the following slurry and CMP conditions: Cabot Microelectronics slurry consisting of ESF-NB diluted 1:10 with DI water, down force: 4.5 psi, platten rotation: 60 rpm, carrier rotation: 59 rpm, back pressure: 2.5 psi, thinning time: 20-30 min.

Figure 2:
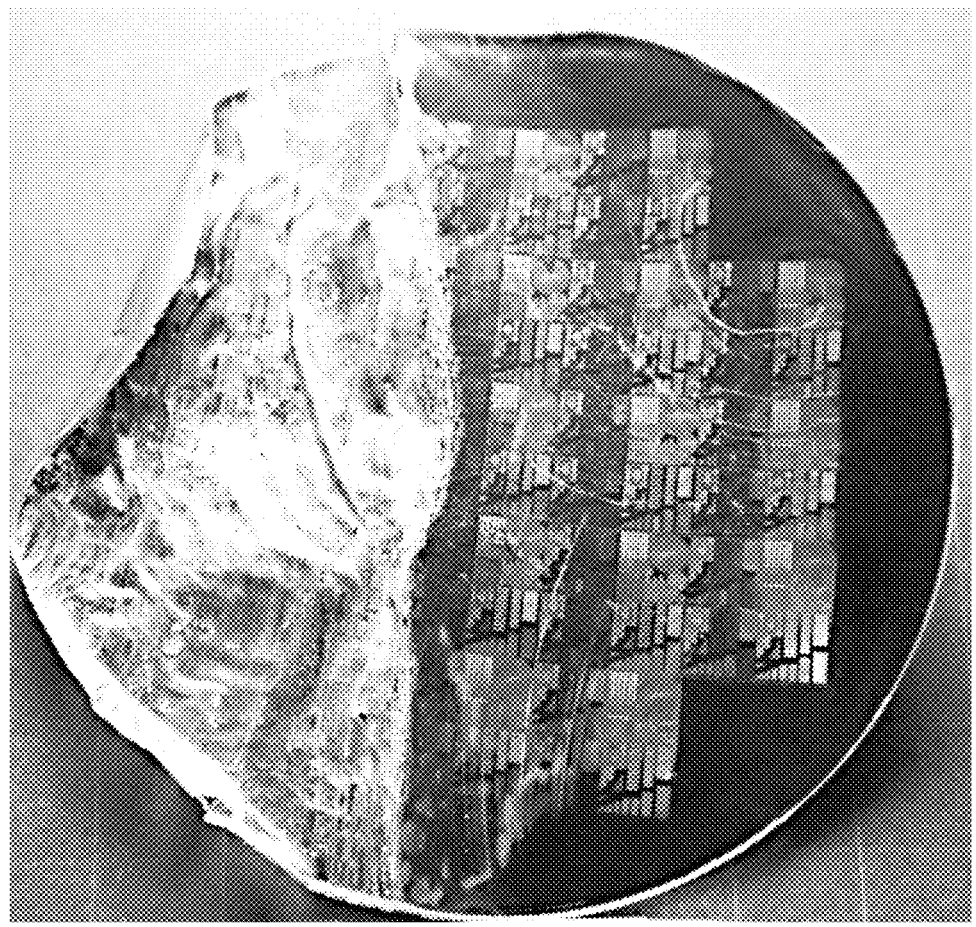
FIG. 2 shows a photograph of a wafer made in accordance with the procedures set forth in Comparative Example 15.

The SEPTON bonded wafer immediately delaminated when the Cu vias were exposed during the thinning process as shown in FIG. 2. This clearly indicates that the wafer bonding formulations based on SEPTON insufficiently adhere to the wafer stack during TSV.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A semiconductor device produced by the method comprising:
   forming a first polymer layer over a surface of a first substrate having structures thereon where said polymer layer comprises a thermally stable and crosslinkable polymer and a surface energy modifier featuring both hydrophilic and hydrophobic properties;
   forming a second polymer layer over a surface of a second substrate where second polymer comprises said thermally stable and cross-linkable polymer and a cross-linking agent;
   wherein said thermally stable and crosslinkable polymer is selected from the group consisting of:
      styrene-diene copolymers; and
      ethylene, propylene, diene monomer (EPDM) polymers;
   bonding thermally said surface of first substrate with said surface of second substrate at a first temperature, said first temperature being lower than a crosslinking temperature of said crosslinking agent;
   subjecting said bonded substrates to a second temperature so as to allow crosslinking and direct bonding of said first polymer on first substrate with said second polymer layer on said second substrate, said second temperature being higher than said first temperature;
   wherein said first polymer layer is a release layer of thickness larger than the height of said structures on first substrate and is about 15 to 20 microns thick and said second polymer layer is an adhesive layer, wherein combined thickness of said release layer and said adhesive layer is about 50 microns; and
   debonding said first substrate from said second substrate at room temperature by applying a mechanical force.

2. The semiconductor device of claim 1, wherein said first substrate is a device wafer and said second substrate is a carrier wafer.

3. The semiconductor device of claim 1, wherein said hydrophobic properties are imparted by polysiloxane backbone.

4. The semiconductor device of claim 1, wherein said hydrophilic properties are imparted by polyether or epoxy functional groups.

5. The semiconductor device of claim 1, wherein said thermally stable and cross linkable polymer is selected from the group consisting of:
   styrene-butadiene copolymer; and
   styrene-isoprene copolymer.

6. The semiconductor device of claim 1, wherein said crosslinking agent is a peroxide crosslinking agent.

7. The semiconductor device of claim 6, wherein said peroxide crosslinking agent is selected from the group consisting of:
   dicumyl peroxide (DCP);
   di(tert-butylperoxyisopropyl) benzene (BPIB);
   3,3,5,7,7-pentamethyl-1,2,4-trioxepane; and
   3,6,9-triethyl-3,6,9,-trimethyl-1,4,7-triperoxonane.

8. The semiconductor device of claim 1, wherein said surface energy modifier is selected from the group consisting of:
   n-octadecyltrichlorosilane;

dodecyltrichlorosilane;
octadecylmethoxydichlorosilane;
octadecyltrimethoxysilane;
dodecyltrimethoxysilane;
dodecyldichloromethoxysilane;
a copolymer of polyether modified polydimethylsiloxane;
a copolymer of polyether modified polysiloxane;
a copolymer of polyether modified dimethylpolysiloxane; and
mixtures in any combination thereof.

9. The semiconductor device of claim 1, wherein first temperature is in the range of from 130° C. to 210° C.

10. The semiconductor device of claim 1, wherein first temperature is in the range of from 150° C. to 190° C.

11. The semiconductor device of claim 1, wherein second temperature is in the range of from 190° C. to 280° C.

12. The semiconductor device of claim 1, wherein said thermally stable crosslinkable polymer exhibits a modulus of from 0.001 GPa to 1 GPa.

13. The semiconductor device of claim 1, wherein said thermally stable crosslinkable polymer exhibits a glass transition temperature ($T_g$) of from 40° C. to 150° C.

14. A method of fabricating a semiconductor device comprising:
    forming a release layer over a surface of a carrier wafer substrate where said release layer comprises a thermally stable and crosslinkable polymer, a crosslinking agent, and a surface energy modifier;
    forming an adhesive layer over a surface of a device wafer substrate where said adhesive layer comprises a thermally stable and cross-linkable polymer, and a crosslinking agent;
    bonding thermally said surface of carrier wafer substrate with said surface of device wafer substrate at a first temperature in the range of from 140° C. to 190° C.;
    subjecting said bonded substrates to a second temperature in the range of from 190° C. to 210° C. so as to allow crosslinking of said crosslinkable polymer on carrier substrate with said crosslinkable polymer on said wafer substrate; and
    debonding said carrier wafer substrate from said device wafer substrate at room temperature by applying a mechanical force.

15. The method of claim 14, wherein said thermally stable and cross linkable polymer is styrene-butadiene copolymer.

16. The method of claim 14, wherein said crosslinking agent is a peroxide crosslinking agent.

17. The method of claim 16, wherein said peroxide crosslinking agent is selected from the group consisting of:
    dicumyl peroxide;
    di(tert-butylperoxyisopropyl) benzene;
    3,3,5,7,7-pentamethyl-1,2,4-trioxepane; and
    3,6,9-triethyl-3,6,9,-trimethyl-1,4,7-triperoxonane.

18. The method of claim 14, wherein said surface energy modifier is selected from is selected from the group consisting of:
    n-octadecyltrichlorosilane;
    dodecyltrichlorosilane;
    octadecylmethoxydichlorosilane;
    octadecyltrimethoxysilane;
    dodecyltrimethoxysilane;
    dodecyldichloromethoxysilane;
    a copolymer of polyether modified polydimethylsiloxane;
    a copolymer of polyether modified polysiloxane;
    a copolymer of polyether modified dimethylpolysiloxane; and
    mixtures in any combination thereof.

19. The method of claim 14, wherein said thermally stable and cross linkable polymer is styrene-butadiene copolymer.

20. A semiconductor device produced by the method of claim 14.

* * * * *